United States Patent [19]

Yanagisawa et al.

[11] Patent Number: 5,234,534
[45] Date of Patent: Aug. 10, 1993

[54] LIQUID-PHASE GROWTH PROCESS OF COMPOUND SEMICONDUCTOR

[75] Inventors: Munehisa Yanagisawa; Akio Nakamura, both of Annaka; Toshio Otaki, Takasaki; Susumu Higuchi, Annaka, all of Japan

[73] Assignee: Shin-Etsu Handotai Co., Ltd., Tokyo, Japan

[21] Appl. No.: 919,331

[22] Filed: Jul. 27, 1992

[30] Foreign Application Priority Data

Jul. 29, 1991 [JP] Japan .................................. 3-212848

[51] Int. Cl.$^5$ ........................ C30B 7/00; H01L 21/208
[52] U.S. Cl. .................................. 156/622; 437/119; 437/130
[58] Field of Search ................. 437/119, 126, 130; 156/621, 622; 148/DIG. 66

[56] References Cited

U.S. PATENT DOCUMENTS 4,110,133  8/1978  Garret et al. ................... 156/622
4,268,327  5/1981  Uragaki et al. ................. 437/130

OTHER PUBLICATIONS

Pak et al, "Suppression of thermal damage of InP by adding Ar in $H_2$ Atmosphere" Jap. J. Appl. Phys, vol. 18 (1979) pp. 1859-1860.

Primary Examiner—Olik Chaudhuri
Assistant Examiner—Ramamohan Kao Paladugu
Attorney, Agent, or Firm—Nikaido, Marmelstein, Murray & Oram

[57] ABSTRACT

A liquid-phase growth process of a compound semiconductor which is capable of effectively controlling the generation of a surface defect and improve the product quality and production yield is disclosed in which before the start of liquid-phase growth, a substrate and a solution are held in a 100% hydrogen atmosphere or a mixed gas atmosphere consisting of more than 80% of hydrogen and the rest of an inert gas, and immediately before the start of the liquid-phase growth, the atmosphere is changed to a mixed gas atmosphere consisting of not more than 60% of hydrogen and the rest of the inert gas.

4 Claims, 1 Drawing Sheet

LIQUID-PHASE GROWTH PROCESS OF COMPOUND SEMICONDUCTOR

BACKGROUND OF THE INVENTION

1. Field of the Invention

The present invention relates to a liquid-phase growth process of a compound semiconductor.

2. Description of the Prior Art

As a liquid-phase growth process of a semiconductor, there are known the tipping method, dipping method and slide boat method. These known liquid-phase growth methods are carried out in an atmosphere of hydrogen gas because hydrogen gas shows a great cleaning effect and has a function to remove an oxide film on a Ga melt.

However, the liquid-phase growth achieved in a hydrogen gas atmosphere is accompanied by generation of hydrogen gas bubbles in the Ga melt, which bubbles will produce a surface defect in the form of a large hole in the substrate and considerably lower the production yield.

To cope with this problem, the liquid-phase growth is performed in an atmosphere of inert gas such as argon. In this instance, however, due to contamination of the substrate before the reaction, a surface defect in the form of a small hole is induced with the result that the production yield is considerably lowered, too.

SUMMARY OF THE INVENTION

An earnest study made by the present inventors on the effect of a change in the composition of the atmosphere in the liquid-phase growth on the surface defect has uncovered the fact that the surface defect can be controlled by changing the composition of the atmosphere in correspondence to succeeding processing steps in the liquid-phase growth. Based on this finding, the present inventors have completed the present invention.

It is an object of this invention to provide a liquid-phase growth process of a compound semiconductor, which is able to effectively control the generation of a surface defect and improve the product quality and the production yield.

To attain the foregoing object, the present invention provides a liquid-phase growth method of a compound semiconductor, which comprises the steps of: before the start of liquid-phase growth, holding a substrate and a solution in an atmosphere consisting of 100% of hydrogen or of a first mixed gas composed of more than 80% of hydrogen and the rest of an inert gas; and immediately before the start of the liquid-phase growth, changing the atmosphere to a second mixed gas atmosphere consisting of not more than 60% of hydrogen and the rest of the inert gas.

Preferably, the inert gas is argon.

The advantageous effects of this invention cannot be obtained when the mixed gas atmosphere has a composition other than specified above and where there is no change in the composition of the gas atmosphere before and after the start of the liquid-phase growth.

Many other objects, advantages and features of the present invention will be better understood from the following description taken in conjunction with the accompanying drawings.

DETAILED DESCRIPTION OF THE INVENTION

The liquid-phase growth process of a compound semiconductor according to this invention is characterized in that the composition of a mixed gas atmosphere is changed immediately before the start of a liquid-phase growth to prevent generation of a surface defect in the form of either a large hole or a small hole.

For instance, when an atmosphere consisting of 5:5 mixture of hydrogen and argon is used throughout a liquid-phase growth process, it is possible to prevent generation of a surface defect in the form of a large hole. However, the use of this mixed gas atmosphere is accompanied by generation of a surface defect in the form of a great number of small holes.

On the other hand, when a 100% hydrogen atmosphere is used throughout the liquid-phase growth process, generation of a surface defect in the form of a small hole can be substantially prevented. However, a surface defect in the form of a large hole is generated.

In addition, when the 100% hydrogen atmosphere is changed to an atmosphere consisting of 5:5 mixture of hydrogen and argon at the time a polycrystal is completely melted down, a great amount of surface defects composed of small holes are produced even though generation of a surface defect in the form of a large hole can be completely prevented.

According to a feature of this invention, before the start of a liquid-phase growth, a substrate and a Ga melt are baked by a hydrogen gas atmosphere (100% hydrogen or a mixed gas consisting of more than 80% of hydrogen and the rest of an inert gas) to reduce the possibility of occurrence of a surface defect in the form of a small hole caused by contamination of the substrate and the Ga melt.

Furthermore, according to another feature of this invention, immediately before the start of the liquid-phase growth, the existing gas atmosphere is replaced by a mixed gas consisting of not more than 50% hydrogen and the rest of the inert gas to reduce the generation of a surface defect in the form of a large hole caused by hydrogen gas bubbles.

Thus, by changing the composition of the atmosphere before and after the start of the liquid-phase growth, it is possible to prevent generation of a surface defect either in the form of a large hole or in the form of a small hole.

The invention will be further described by way of the following examples which should be construed as illustrative rather than restrictive.

Figure 1:
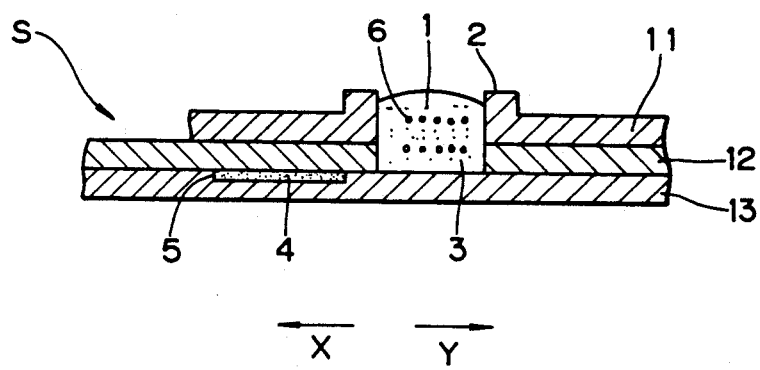
FIG. 1 is a schematic cross-sectional view of a portion of a slide boat used in Example 1, described later, of the present invention.

FIG. 1 shows a slide boat used to carry out the liquid-phase growth process of the invention. In FIG. 1, reference character S is a slide boat, 1 is a Ga melt, 2 is a receptacle, 3 is a cavity, 4 is a single crystal substrate, 5 is a recess, 6 is a GaP polycrystal, 11 is an upper slide plate, 12 is an intermediate slide plate and 13 is a lower slide plate.

EXAMPLE 1

Using the slide boat S shown in FIG. 1, an n-type GaP epitaxial layer was grown on the substrate 4 in the sequence described below.

(1) Insert the slide boat S into a reaction furnace with a Ga melt 1 and a single crystal substrate 4 held on the slide boat S.

Figure 2:
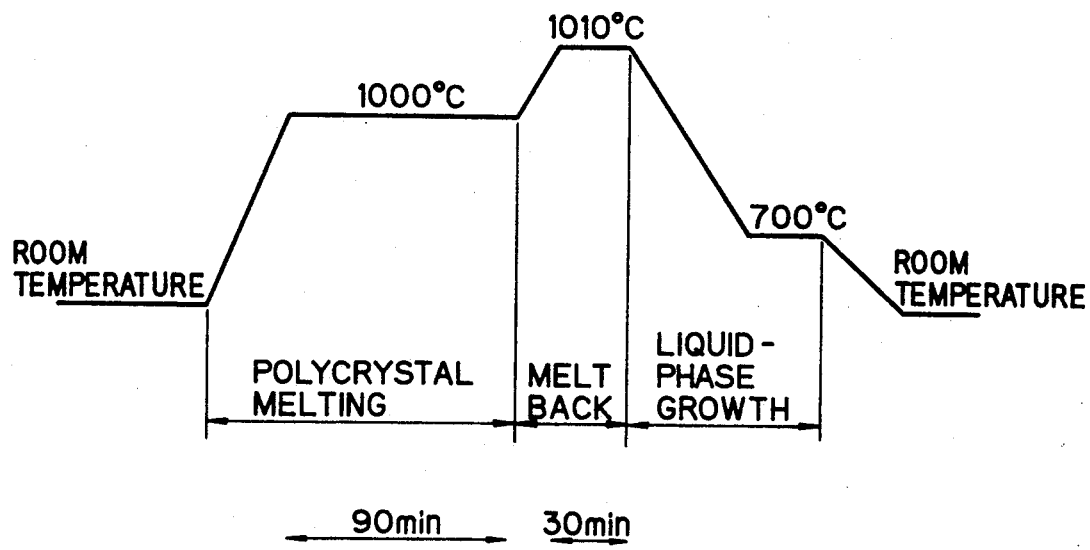
FIG. 2 is a graph showing a correlation between the temperature and the time observed when Example 1 is achieved.

(2) While supplying a 100% hydrogen gas ($H_2$) into the reaction furnace, heat the reaction furnace up to 1000° C. and thereafter maintain the reaction furnace at the same temperature for 90 minutes, thereby causing the GaP polycrystal to melt down into the Ga melt 1 or solution (polycrystal melting in FIG. 2). In this instance, by $H_2$, the single crystal substrate 4 is cleaned and an oxide film on the Ga melt 1 is removed.

(3) Move the intermediate slide plate 12 in the direction of the arrow X until the cavity 3 is in registry with the single crystal substrate 4, so that the Ga melt 1 is brought into contact with the single crystal substrate 4.

(4) Heat the reaction furnace up to 1010° C. and hold the reaction furnace at this temperature for 30 minutes, thereby causing the single crystal substrate to melt back into the Ga melt 1 (melt back in FIG. 2).

(5) Change 100% $H_2$ to a mixed gas consisting of 50% of $H_2$ and 50% argon and then start cooling of the reaction furnace at the rate of 1°–3° C. per minute, thereby commencing a liquid phase growth of an epitaxial layer.

(6) When the reaction furnace is cooled down to 700° C., move the intermediate slide plate 12 in the direction of the arrow Y, thereby terminating the liquid-phase growth.

(7) Visually inspect the presence of a surface defect in a surface of the thus obtained epitaxial layer on the substrate 4.

The visual inspection indicated that neither a surface defect in the form of a large hole nor a surface defect in the form of a small hole could be found out. Regarding both of the large-hole surface defect and the small-hole surface defect, the average generation rate was 0%.

For better understanding of the forgoing sequence of the Example 1, a correlation between the temperature and the time is shown in FIG. 2.

COMPARATIVE EXAMPLE 1

An n-type GaP epitaxial growth layer was produced by repeating the procedure of Example 1 except that throughout the process, an atmosphere consisting of 100% hydrogen was used. A visual inspection of the obtained epitaxial layer on the substrate revealed the generation of both a surface defect composed of a large hole and a surface defect composed of a small hole. The average generation rate was 3.8% about the large-hole surface defect and 5.4% about the small-hole surface defect.

COMPARATIVE EXAMPLE 2

An n-type GaP epitaxial growth layer was produced by repeating the procedure of example 1 with the following exceptions. During a first period of 30 minutes of the step of polycrystal melting, an atmosphere consisting of 5:5 mixture of hydrogen and argon was used, and the rest (60 minutes) of the polycrystal melting step was carried out in a 100% hydrogen atmosphere. In addition, the melt back step and the liquid-phase growth step were carried out in an atmosphere consisting of 5:5 mixture of hydrogen and argon. A visual inspection of the obtained epitaxial substrate failed to find the generation of a large-hole surface defect but revealed a small-hole surface defect. The average generation rate was 0.0% about the large-hole surface defect and 41.5% about the small-hole surface defect.

COMPARATIVE EXAMPLE 3

An n-type GaP epitaxial growth layer was produced by repeating the procedure of Example 1 with the exception that a first period of 30 minutes of the polycrystal melting step was carried out in an atmosphere consisting of 5:5 mixture of hydrogen and argon, and the rest (60 minutes) of the polycrystal melting step, the melt back step and the liquid-phase growth step were carried out in a 100% hydrogen atmosphere. A visual inspection of the obtained epitaxial substrate indicated that both a large-hole surface defect and a small-hole surface defect were induced. The average generation rate was 3.3% about the large-hole surface defect and 5.3% about the small-hole surface defect.

COMPARATIVE EXAMPLE 4

An n-type GaP epitaxial growth layer was produced by repeating the procedure of Example 1 with the exception that the polycrystal melting step was carried out in a 100% hydrogen atmosphere, and the melt back step and the liquid-phase growth step were carried out in an atmosphere consisting of 5:5 mixture of hydrogen and argon. A visual inspection of the obtained epitaxial substrate traced the generation of a small-hole surface defect only. The average generation rate was 0.0% about the large-hole surface defect and 3.3% about the small-hole surface defect.

In the examples described above, a melt back step is included, however, the present invention is also applicable to a liquid-phase growth process devoid of the melt back step.

The liquid-phase growth process of this invention is carried out by the slide boat method, as described above. This is illustrative rather than restrictive and, hence, the present invention is also applicable to the tipping method and the dipping method.

It has been experimentally confirmed that after the start of the liquid-phase growth, the concentration of hydrogen in the atmosphere must be not more than 60%, and a satisfactory result cannot be obtained when the hydrogen concentration exceeds this upper limit.

As described above, the liquid-phase growth process according to this invention is effective to prevent generation of a surface defect and improve the product quality and the production yield.

What is claimed is:

1. A liquid-phase growth process of a compound semiconductor, comprising the steps of:
    before the start of liquid-phase growth, holding a substrate and a solution in a first mixed gas atmosphere consisting of more than 80% of hydrogen and the rest of an inert gas; and
    immediately before the start of the liquid-phase growth, changing said first mixed gas atmosphere to a second mixed gas atmosphere consisting of not more than 60% of hydrogen and the rest of said inert gas.

2. A liquid-phase growth process according to claim 1, wherein said inert gas is argon.

3. A liquid-phase growth process of a compound semiconductor, comprising the steps of:

before the start of liquid-phase growth, holding a substrate and a solution in a 100% hydrogen atmosphere; and immediately before the start of the liquid-phase growth, changing said 100% hydrogen atmosphere to a mixed gas atmosphere consisting of not more 60% of hydrogen and the rest of an inert gas.

4. A liquid-phase growth process according to claim 3, wherein said inert gas is argon.

* * * * *